(12) United States Patent
Shiraishi

(10) Patent No.: US 6,243,158 B1
(45) Date of Patent: *Jun. 5, 2001

(54) PROJECTION EXPOSURE APPARATUS AND METHOD

(75) Inventor: Naomasa Shiraishi, Urawa (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/905,330

(22) Filed: Aug. 4, 1997

(30) Foreign Application Priority Data

Aug. 5, 1996 (JP) .................................................. 8-221752

(51) Int. Cl.$^7$ .......................... G03B 27/42; G03B 27/32; G01B 11/00
(52) U.S. Cl. ............................... 355/53; 355/77; 356/399
(58) Field of Search ............................... 355/43, 53, 67, 355/77; 356/399, 400, 401; 250/548

(56) References Cited

U.S. PATENT DOCUMENTS

| 5,243,195 | | 9/1993 | Nishi | 250/548 |
| 5,532,091 | * | 7/1996 | Mizutani | 355/53 |
| 5,654,553 | * | 8/1997 | Kawakubo et al. | 250/548 |
| 5,671,057 | * | 9/1997 | Kawai | 356/399 |
| 5,745,242 | * | 4/1998 | Hata | 356/401 |
| 5,751,404 | * | 5/1998 | Murakami et al. | 355/53 |

* cited by examiner

*Primary Examiner*—Russell Adams
*Assistant Examiner*—Peter B. Kim
(74) *Attorney, Agent, or Firm*—Morgan, Lewis & Bockius LLP

(57) ABSTRACT

A projection exposure method, in which alignment of an image of a mask pattern on a mask and a substrate to be exposed is performed prior to transferring the image of the mask pattern onto the substrate via a projection optical system, by detecting an alignment mark on the substrate using a mark detection system, is provided. The projection exposure method includes the steps of measuring a present baseline data, the baseline data indicating a positional relationship between a projection point of a mask pattern image and a detection point of the mark detection system, and performing a predetermined computation using the measured present baseline data and at least one previously measured baseline data to derive a new baseline data. The method further includes the steps of detecting the position of the alignment mark on the substrate using the mark detection system, and aligning the projected image of the mask pattern with the substrate in accordance with the derived new baseline data and the detected position of the alignment mark.

16 Claims, 2 Drawing Sheets

PROJECTION EXPOSURE APPARATUS AND METHOD

This application claims the benefit of Japanese Application No. 08-221752, filed on Aug. 5, 1996, which is hereby incorporated by reference.

BACKGROUND OF THE INVENTION

1. Field of the Invention

The present invention relates to a projection exposure method and the apparatus thereof, and more particularly, to a projection exposure method and projection exposure apparatus used in manufacturing processes of fine circuit patterns, semiconductor integrated circuits, liquid crystal displays, etc.

2. Discussion of the Related Art

In the photolithographic processes for manufacturing semiconductor devices, liquid -crystal display devices, etc., a projection exposure apparatus equipped with a projection optical system has been used to project the pattern image on a photomask (or reticle, generally referred to as "reticle") onto each shot region of a substrate, such as a wafer or glass plate, (generally referred to as "wafer") coated with a photosensitive material. In recent years, a step-and-repeat type exposure apparatus, in particular, a reduction projection type exposure apparatus (stepper) has become more and more popular. In the step-and-repeat type exposure apparatus, the wafer is held on a wafer stage which is movable in a two-dimensional plane. The wafer stage moves stepwise to successively expose the shot areas of the wafer with the pattern image of the reticle.

A semiconductor device or the like is, in general, made of a plurality of patterned layers on the wafer, each of which is formed using photolithography processes involving exposure operations. In such projection exposure operations, it is important to accurately align the circuit patterns already formed on the wafer with a pattern image of the reticle to be transcribed. Thus, alignment of the wafer and the reticle needs to be performed with high precision.

One method for performing such alignment is as follows. A wafer alignment mark on the wafer is illuminated with a light beam having the same wavelength as exposing light (exposure wavelength) to project the image thereof onto the patterned surface of the reticle adjacent a reticle alignment mark formed on the reticle. Then, a positional relationship between the image of the wafer alignment mark and the reticle alignment mark is directly measured to derive a relative positional relationship between the wafer and the reticle and to thereby perform alignment. This method is referred to as the "reticle reference method." However, this reticle reference method has a disadvantage in that the wafer alignment mark and its neighborhood on the wafer are exposed with the light beam of exposure wavelength. Because of this, the reticle reference method is not presently used.

In a more popular alignment method, the position of the alignment mark on the wafer is detected using a light beam having a different wavelength from that for exposure. Examples of this type of alignment method are a through-the-lens (TTL) method, in which a projection optical system is used as a portion of an optical system detecting the wafer alignment mark, and an off-axis method, in which a separate optical system is used to detect the position of the wafer mark. In these systems, the reticle and wafer are not aligned directly, but aligned indirectly using a reference mark (fiducial mark) provided in the projection exposure apparatus (normally on the wafer stage holding the wafer).

The off-axis method is explained in detail as an example. First, prior to exposure, the above-mentioned fiducial mark, formed on the wafer stage, is aligned with the image of the reticle alignment mark and then the position of the wafer stage is measured. Next, the fiducial mark is moved to a position located below the optical system of a wafer mark detection system and is aligned with a detection reference of the optical system for the wafer mark detection system. Then, the position of the wafer stage is measured. The difference between these two wafer stage positions is referred to as "baseline amount," and the above-mentioned sequence is referred to as "baseline measurement."

Before actually exposing the wafer, the wafer stage is positioned such that a position detection mark formed on the wafer is aligned with the detection reference of the wafer mark detection optical system. Subsequently, the wafer stage is moved to a position displaced by the baseline amount so that the existing circuit pattern on the wafer can be aligned with the image of the reticle pattern.

When a plurality of wafers are sequentially exposed in the conventional method above, the above-mentioned baseline measurement is performed only once at the beginning of the exposure sequence, and the alignment and exposure of the wafers is performed using the baseline amount thus measured. Therefore, a positional relationship between the reticle projection image and the optical system of the wafer mark detection system is not checked during the exposure sequence for the plurality of wafers of the same kind (during repetition of the same process). In other words, superposition exposure is performed under the assumption that the positional relationship will not change.

However, since the minimum line-width of circuit patterns has become extremely small due to advancements in semiconductor technology, small fluctuations in the above-mentioned positional relationship, which were not a problem in the past, have come to impose significant effects on alignment precision and the performance of the semiconductor integrated circuit manufactured thereby. Moreover, since measurement errors in the baseline amount itself directly contribute to the alignment error, higher accuracy has become a necessity in determining the baseline amount.

For this reason, a method for accurately measuring the baseline amount, which does not have variations over time, is required. Theoretically, when a plurality of wafers are to be exposed, it is possible to measure the baseline amount several times and take an average to determine a precise baseline amount every time a specified number of wafers are exposed.

However, since a processing time of approximately 10 to 20 seconds is required for each baseline measurement, if a plurality of baseline measurements are performed for each exposure of a specified number of wafers as described above, this baseline measurement method leads to a considerable reduction of throughput in the projection exposure apparatus. Therefore, in reality, it is difficult to apply this method.

SUMMARY OF THE INVENTION

Accordingly, the present invention is directed to a projection exposure apparatus and method that substantially obviates the problems due to limitations and disadvantages of the related art.

An object of the present invention is to provide a projection exposure method that can improve the precision of alignment without sacrificing throughput.

Another object of the present invention is to provide a projection exposure apparatus that can improve alignment precision without sacrificing throughput.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a projection exposure method in which alignment of an image of a mask pattern on a mask and a substrate to be exposed is performed prior to transferring the image of the mask pattern onto the substrate via a projection optical system, by detecting an alignment mark on the substrate using a mark detection system, the projection exposure method including the steps of measuring a present baseline data, the baseline data indicating a positional relationship between a projection point of a mask pattern image and a detection point of the mark detection system; performing a predetermined computation using the measured present baseline data and at least one previously measured baseline data to derive a new baseline data; detecting the position of the alignment mark on the substrate using the mark detection system; and aligning the projected image of the mask pattern with the substrate in accordance with the derived new baseline data and the detected position of the alignment mark.

In another aspect, the present invention provides a projection exposure apparatus for transferring an image of a mask pattern on a mask onto a substrate to be exposed via a projection optical system, the projection exposure apparatus including a mark detection system for detecting a position of an alignment mark on the substrate; a measurement device for measuring a baseline data, which indicates a positional relationship between a projection point of a mask pattern image and a detection point of the mark detection system; a computation unit for deriving a new baseline data using a predetermined computation in accordance with a present baseline data measured by the measurement device and at least one baseline data measured previously; and an alignment device for aligning the projected image of the mask pattern with the substrate in accordance with the position of the alignment mark on the substrate detected by the mark detection system and the new baseline data derived by the computation unit.

In a further aspect, the present invention provides a method of determining a baseline data for use in a projection exposure apparatus, the method including the steps of (a) measuring the baseline data by measuring a positional relationship between a projection point of the mask pattern image and a reference point of a substrate alignment detector; (b) detecting a position of an existing pattern on a substrate and aligning the image of the mask pattern with the existing pattern on the substrate in accordance with the baseline data measured in the step (a); (c) exposing the image of the mask pattern onto the substrate; (d) measuring the baseline data; and (e) processing the baseline data measured in step (a) and the baseline data measured in step (d) to obtain a calculated baseline data.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
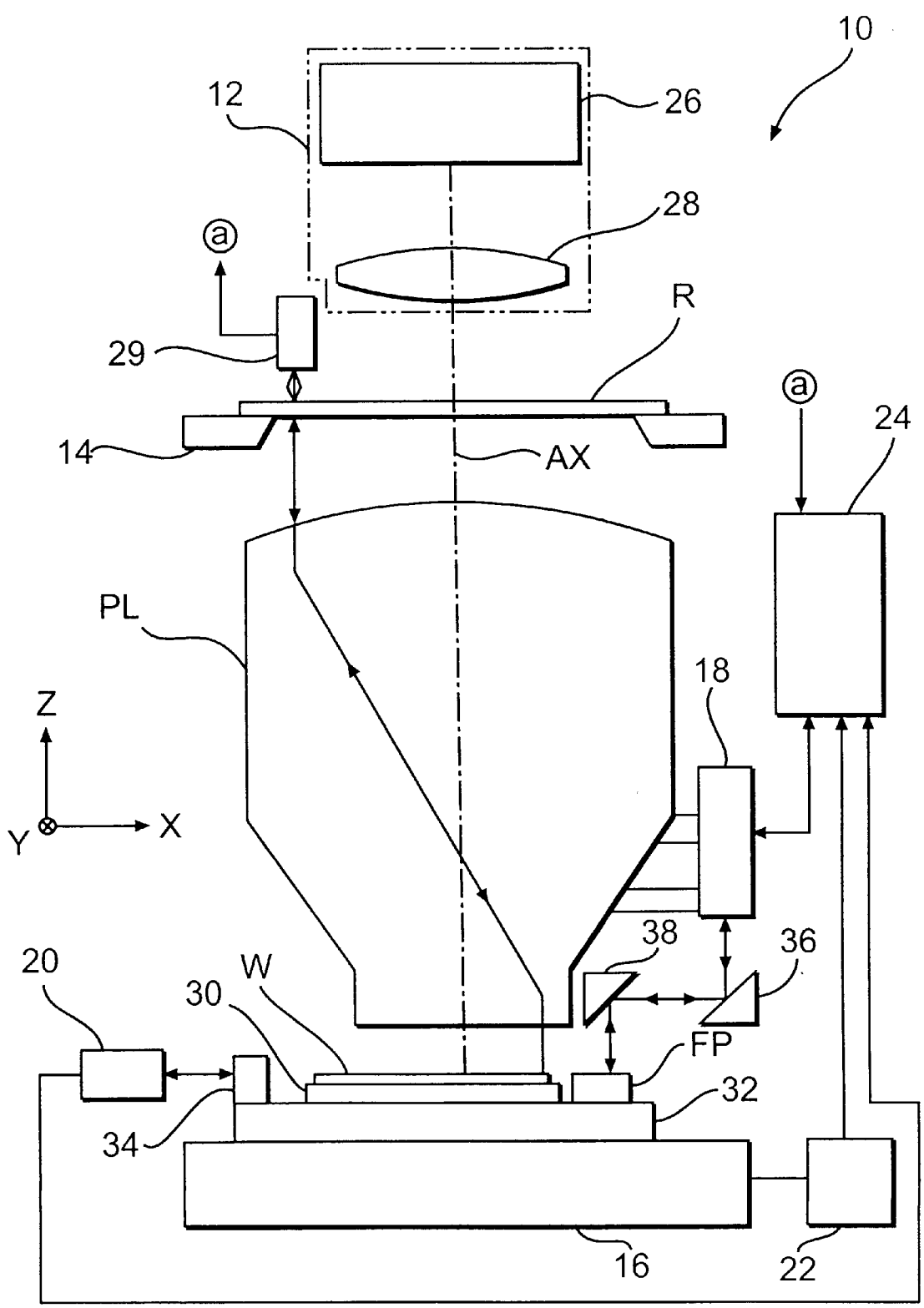
FIG. 1 schematically shows the structure of a projection exposure apparatus according to a preferred embodiment of the present invention.

The present invention is explained below with reference to FIG. 1. In FIG. 1, which illustrates the general structure of a projection exposure apparatus 10 in accordance with a preferred embodiment. The projection exposure apparatus 10 is a reduced projection type exposure apparatus employing a step-and-repeat scheme (so-called "stepper").

The projection exposure apparatus 10 is provided with an illumination system 12 for illuminating reticle R (mask) with illumination light for exposure, a reticle stage 14 for holding the reticle R, a projection optical system PL for projecting the image of the pattern formed on the reticle R onto wafer W (substrate) to be exposed, and a wafer stage 16 for holding the wafer W, which is movable in a two-dimensional plane. The projection exposure apparatus 10 further includes an off-axis type alignment microscope 18 for detecting the alignment mark (wafer mark) as a position detection mark formed on the wafer W, a laser interferometer 20 for measuring the position of the wafer stage 16, a driving system 22 for driving the wafer stage 16, and a main controller 24 including a minicomputer (or microcomputer) for controlling the entire apparatus.

The illumination system 12 includes a light source (mercury lamp, excimer laser, or the like), shutter, blind, etc. (none of which are shown), and includes a uniform luminance optical system 26 having an input lens, fly-eye lens, and relay lens (none of which are shown), and a main condenser lens 28.

The illumination system 12 illuminates the pattern on the bottom surface of the reticle R (pattern formation face) at a uniform luminance distribution with illumination light for exposure from the light source. Here, monochromatic light (or quasi-monochromatic light) supplied from the uniform luminance optical system 26 may be used as the illumination light for exposure (exposing radiation flux). The wavelength thereof (exposure wavelength) is 265 nm of a mercury emission line, or 248 nm of a KrF excimer laser, for example.

The reticle R is fixed to the reticle stage 14 by vacuum suction, for example. The reticle stage 14 is finely movable in the X direction (left and right directions on the plane of FIG. 1), the Y direction (direction perpendicular to the plane of FIG. 1), and the θ direction (rotational direction within the plane) through driving systems (not shown). A reticle alignment mark, for example, a cross-shaped mark (not shown), for aligning the reticle is formed on the reticle R along with the reticle pattern, and a reticle microscope 29 for detecting the reticle alignment mark is placed above the reticle stage 14. This reticle microscope 29 is an image processing type alignment sensor, and is constructed of a light source that emits a light beam of the exposure wavelength, an index plate having index marks thereon, an optical system including an object lens, an image pick-up device such as a charge coupled device (CCD), and a signal processing circuit. In the preferred embodiment, the reticle microscope 29 is used for reticle alignment and for detecting the position of the reticle mark relative to a fiducial mark described below when performing baseline measurement. The output of the reticle microscope 29 is supplied to the main controller 24.

The above-mentioned projection optical system PL has the optical axis AX parallel to the Z direction and perpendicular to the plane of the reticle stage 14 movement, and is telocentric on both sides with a predetermined reduction factor $\beta$ ($\beta=\frac{1}{5}$, for example). Therefore, when the reticle R is illuminated by illumination light with a uniform luminance, after aligning the pattern on the reticle with the shot area on the wafer W (described below), the reticle pattern on the pattern formation surface is reduced by reduction factor $\beta$ through the projection optical system PL, and the reduced image is projected on the wafer W coated with a photoresist. As a result, the reduced image of the reticle pattern is formed on each shot area on the wafer W (the area of an LSI chip, for example).

The wafer W is fixed over a wafer table 32 via a wafer holder 30 by vacuum suction, etc., and the wafer table 32 is fixed on the above-mentioned wafer stage 16. This wafer stage 16 is actually composed of a Y-stage movable in the Y direction (direction perpendicular to the plane of FIG. 1) with respect to a base support (not shown), and an X stage movable in the X direction (lateral direction on the plane of FIG. 1) with respect to the Y stage. In FIG. 1, these stages are collectively represented by the wafer stage 16.

A movable mirror 34 is installed on one end of the wafer table 32, and the laser interferometer 20 is installed to be optically coupled to the movable mirror 34. The laser interferometer 20 projects a laser beam onto the movable mirror 34 and measures the position of the wafer stage 16 by receiving the reflected light therefrom. The movable mirror actually includes an X movable mirror having the reflecting face perpendicular to the X axis and a Y movable mirror having the reflective face perpendicular to the Y axis, and the corresponding laser interferometer includes an X laser interferometer for measuring the X direction position and a Y laser interferometer for measuring the Y direction position. In FIG. 1, these are collectively represented as movable mirror 34 and laser interferometer 20. Accordingly, the XY coordinates of the wafer stage 16 are measured using laser interferometer 20.

The measurement values of the laser interferometer 20 are supplied to the main controller 24, and the main control apparatus 24 performs positioning of the wafer stage 16. Thus, the wafer W is positioned via the driving system 22 while the measurement values of this laser interferometer 20 are monitored.

A fiducial plate FP is fixed to the wafer stage 16 such that the surface thereof has the same height as the surface of the wafer W. Various types of fiducial marks including a fiducial mark for use in baseline measurement are formed on the surface of the fiducial plate FP.

The alignment microscope 18 is fixed to the side face of the projection optical system PL. In the present preferred embodiment, an image processing type is used for the alignment microscope 18. The alignment microscope 18 is constructed of a light source emitting broadband illumination light, such as a halogen lamp, an object lens, an index plate, an image pickup device, such as a CCD, a signal processing circuit, and a computation circuit (not shown). The illumination light emitted from the light source in the alignment microscope 18 passes through the object lens in the alignment microscope 18, and illuminates the wafer W (or fiducial plate FP) via reflecting mirrors 36, 38. The reflected light from the wafer mark region (not shown) on the surface of this wafer W returns to the alignment microscope 18 via the reflecting mirrors 36, 38, and passes through the object lens and index plate, to form the image of the wafer mark on the image pickup surface of the CCD, together with the image of the index mark on the index plate. The photoelectrically converted signals of these images are processed at the signal processing circuit, and the positional relationship of the wafer and the index mark is calculated at the computation circuit. In the present preferred embodiment, the mark detection system is composed of the alignment microscope 18 and reflecting mirrors 36, 38.

Prior to detecting the wafer mark by this mark detection system, the above-mentioned baseline measurement is performed. This procedure is explained below.

(1) First, alignment of the reticle R is performed prior to baseline measurement. In this process, the position of the reticle alignment mark on the reticle R (not shown), i.e., the position of the reticle R, is aligned with respect to the center of the index mark on the index plate (detection standards in the reticle microscope 29, for example) by driving the reticle stage 14. This reticle alignment is controlled by the main controller 24. When successive exposure processes are performed on a plurality of wafers, this reticle alignment may be performed only at the beginning of exposure of the plurality of wafers.

(2) The fiducial plate FP on the wafer table 32 is moved to the position of the image of the reticle alignment mark projected via the projection optical system PL. This movement is controlled by the main controller 24 via the driving system 22. As stated above, the surface of the fiducial plate FP is positioned at substantially the same height as the surface of the wafer W (in the optical axis direction), and the fiducial mark (not shown) is formed on this surface. Using detection light having the same wavelength as exposure light, the reticle microscope 29 detects the position of the reticle alignment mark relative to the fiducial mark. In this detection, since the detection wavelength is the same as the exposure wavelength, the relation between the projected position of the reticle alignment mark and the projected position of other patterns (circuit patterns) on the reticle R to be formed in actual exposure can be maintained at a designed relation without being affected by chromatic aberration.

At the same time, the position of the wafer table 32 is measured by the laser interferometer 20 via the movable mirror 30 on the wafer table 32, and the measurement result is supplied to the main controller 24. The main controller 24 stores the sum of the measurement result of the laser interferometer 20 and the relative position output from the reticle microscope 29 in a memory (not shown) as the reticle position.

(3) The main controller 24 drives the wafer stage 16 via the driving system 22 and moves the fiducial plate FP to the vicinity of the detection field of the mark position detection system, i.e., the wafer microscope 18. The wafer microscope 18 then detects the relative positional relationship between the center of the index mark on the index plate (detection center) in the wafer microscope 18 and the fiducial mark on the fiducial plate FP. This relative positional relationship and the output value of the laser interferometer 20 at this wafer stage position (position of the wafer table 32) are supplied to the main controller 24 and the sum of these detected values is stored as the detection position of the wafer microscope 18. In addition, the difference between the above-mentioned reticle position and the wafer microscope detection position is stored in the memory (not shown) as "baseline measurement value."

In addition to the above-mentioned sequences (1) through (3), averaging operations are performed in the present preferred embodiment.

Successively processing a plurality of wafers (referred to as "lot") and repeating the baseline measurement at every predetermined number of wafers is explained below, and shown in FIG. 2.

Figure 2:
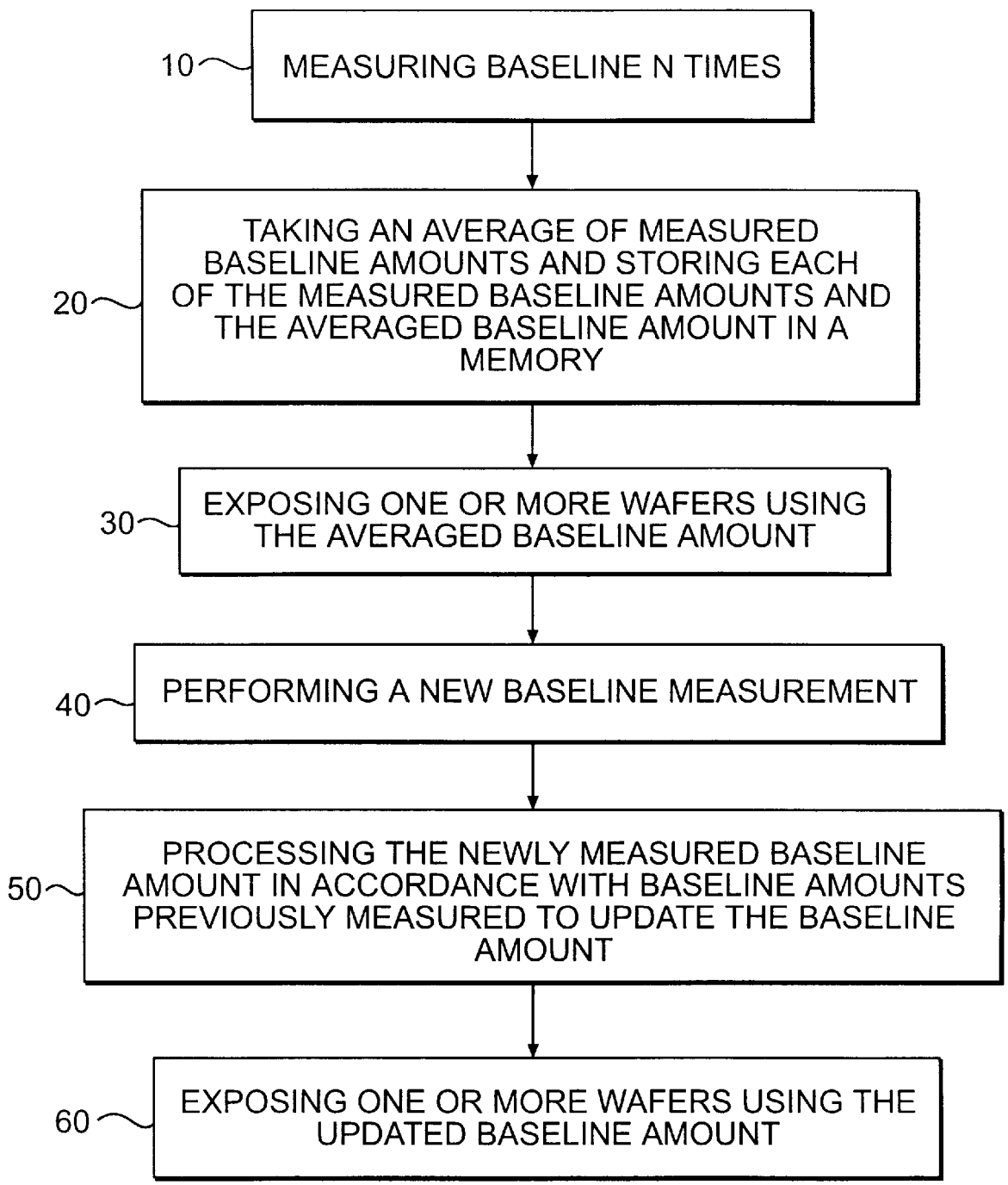
FIG. 2 is a flow chart describing a projection exposure method according a preferred embodiment of the present invention.

In performing the baseline measurement at the beginning of the lot, baseline measurement of the above-mentioned sequence is repeated N times (for example, five (5) times) since there is no accumulation of prior measurement values (step 10 of FIG. 2). The main controller stores each baseline measurement value that is measured, and memorizes the mean value thereof as the baseline amount, as shown in step 20 of FIG. 2.

When measuring the baseline amount other than at the beginning of the lot, e.g., after a predetermined number of wafers (substrates) are exposed, shown as step 30, a single new baseline measurement is performed; (step 40 of FIG. 2). The "new baseline amount" is calculated using a predetermined computation method based on that measured value and the abovementioned previously stored values, shown as step 50, and one or more wafers can thus be exposed using the new baseline amount (step 60). For example, the simple averaging method of the newly measured (present) baseline measurement value and one, two, or more of the previously measured baseline measurement values can be derived as the baseline amount. By using such prior baseline measurement values concomitantly, the measurement errors (fluctuations) among a plurality of measurements are averaged, and accordingly, the reliability of the baseline amount can be increased.

Alternatively, calculation can be performed based on the following equation to derive a weighted average BL by assigning the maximum weight W0 to the newly measured (present) baseline measurement value BL0 and decreasing weight series W1, W2, W3, . . . to older baseline measurement values BL1, BL2, BL3.

$$BL=(\Sigma Wn \Sigma BLn)/\Sigma Wn, \quad (1)$$

where n=0, 1, 2, 3, . . . , and W0>W1>W2>W3 . . . .

As the specific values of the weight, numeric values which are subsequently divided by 2 for older values may be used: W0=1, W1=0.5, W2=0.25, and W3=0.125, for example.

When performing this type of weighted average, for example, even if the positional relationship of the reticle projection image and the mark detection system (18, 36, 38) including the wafer microscope 18 changes with time (in this case, such change (superposition deviation) affects the measured baseline amount because of usage of measured values), by the concomitant use of previously measured values, the effects of this change can be minimized since averaging is performed by assigning a smaller weight to more previously measured values.

For example, only four of the most recent measurement data may be used in the calculation of the baseline. In this case, the main controller 24 can store four most recent baseline measurement values and older measurement values can be deleted. Of course, the number of measurements is not limited to four, and any number can be used.

The method of calculating the baseline amount incorporating previously measured values is not limited to the above-mentioned weighted average. For example, the updated baseline amount can be obtained by applying the least-squares method to previously measured values and the present (most recent) measured value. Alternatively, the baseline may be estimated using a numeric filter such as a Kalman filter.

Also, the frequency of the above-mentioned baseline measurement is not limited. For example, it may be performed after each exposure of a wafer. Alternatively, the frequency may be increased in the first half of a lot (every time after a small number of wafers are exposed), and the frequency may be reduced in the latter half of the lot. Also, the baseline measurement may be performed at any interval. When the interval at which baseline measurements is performed are not constant, it is desirable that the weight amount in the above-mentioned weighting averaging be made variable, and that the factor of elapsed time be added in weighting, as indicated in the following equation.

$$Wn=\exp(-A*Tn), \quad (2)$$

where A is an arbitrary positive constant, and Tn is the time from the measurement of the nth data until the present. This way, the larger weights can be assigned to the more recent baseline measurement amounts.

In the projection exposure apparatus 10 of this preferred embodiment, the superposed exposure of the wafer W is performed after the above-mentioned baseline measurement sequence. The position of the wafer alignment mark (not shown) on the wafer W is detected by the mark detection system (18, 36, 38). Under this condition, the sum of the relative positional relationship of the wafer alignment mark and the index mark center in the above-mentioned wafer microscope 18 and the position of the wafer table 32 (output value of the laser interferometer 20) is recognized by the main controller 24 as mark position. Next, the main controller 24 shifts the wafer W (i.e., the wafer table 32) from this mark position by the sum of the baseline amount and the design coordinates of the wafer alignment mark while monitoring the position of the wafer table 32 in accordance with the measurement value of the laser interferometer 20. Thus, the projection image of the pattern on the reticle R is accurately aligned with the existing pattern on the wafer W. When exposure is performed in this state, the pattern on the reticle R is projected and transferred onto the wafer W.

In this way, exposure is performed in a step-and-repeat mode by repeating exposure (projection transfer) while shifting the shot area on the wafer W to the projection position of the image of the reticle pattern in sequence.

Also, the above-mentioned step-and-repeat mode exposure operation may be performed in a so-called die-by-die mode, in which the alignment mark in each shot area on the wafer W is detected each time to align and expose the shot area, or in a so-called EGA (enhanced global alignment) mode, in which the alignment marks in multiple shot areas are detected prior to exposure to determine the arrangement of the exposure shots through statistical processing of these detected values, and exposure of the shot areas is performed based on this arrangement information.

As is clear from the explanation up to this point, in the present preferred embodiment, the measurement device for measuring the baseline amount includes the reticle microscope 29, movable mirror 34, laser interferometer 20, wafer stage 16, driving system 22, fiducial plate FP, and main controller 24. The alignment device includes the movable mirror 34, laser interferometer 20, wafer stage 16, driving system 22, and main controller 24. The computation includes the main controller 24.

As explained above, in accordance with the present preferred embodiment, in baseline measurement during lot processing (successive processing of a plurality of wafers) in particular, since the baseline amount is determined by incorporating previous baseline measurement values, errors are reduced in the baseline amount by averaging. Also, since alignment is performed using this baseline amount, a more precise alignment is possible. Moreover, since baseline measurement is performed after a predetermined number of wafers are exposed, the reduction in throughput due to additional baseline measurements is negligible; the time required to determine baseline can be shortened, as compared with when baseline measurement is performed many times for each wafer, thereby maintaining high throughput.

Also, in the above embodiment, the positional relation between the fiducial mark and the reticle alignment mark at the time of baseline measurement is measured by directing an illumination light beam having the same wavelength as exposure light beam through the reticle microscope to project the image of the reticle alignment mark onto the fiducial plate FP. Alternatively, the apparatus also may be constructed such that a light emitting mechanism (illumination light source) is installed in the fiducial plate FP and the image of the fiducial mark is formed in the vicinity of the reticle alignment mark.

As explained above, according to the present invention, alignment accuracy can be increased without sacrificing throughput.

In a first step, the baseline amount is measured. This is the interval between the projection image position of the pattern image of the mask and the detection center of the mark detection system. In a second step, a new baseline amount is calculated by a specified computation based on the present baseline amount that was measured in the first step and at least one baseline amount that has been previously measured. In a third step, the position of the mark on the substrate to be exposed is detected using the mark detection system. Then, in a fourth step, alignment of the projection image of the mask pattern and the substrate to be exposed is performed based on the baseline amount calculated in the second step and the mark position detected in the third step, and next the image of the pattern formed on the mask is transferred to the substrate to be exposed via the projection optical system. Therefore, when multiple substrates are exposed, for example, even if the baseline amount changes due to various factors during exposure, a new baseline amount has been calculated in the second step and the alignment of the projection image of the mask pattern and the substrate to be exposed is performed in the fourth step based on this new baseline amount and the mark position detected in the third step, and highly accurate alignment can be performed without being affected by changes in the baseline amount. Accordingly, the projection image of the mask pattern can be superposed and transferred accurately onto the substrate in subsequent exposure processes.

The calculation of the new baseline amount in the second step is performed based on the present baseline amount measured in the first step and at least one baseline amount that has been previously measured. Therefore, the baseline measurement error (deviation) is reduced and the reliability of the baseline amount can be increased. Thus, measurement of the present baseline amount in the first step need only be performed once. As a result, there is hardly any reduction in throughput and alignment, which takes into account changes in the baseline amount.

The measurement and computation in the first and second steps may be performed for each substrate to be exposed. However, considering the importance of throughput, it is desirable that this be performed after a certain number of substrates is exposed.

In the specified computation in the second step, the new baseline amount may be calculated by simply taking an average of the present baseline amount and one, two, or more baseline amounts that have been previously measured. Alternatively, averaging may be performed assigning greater weights to the present baseline amount and smaller weights to baseline amounts that have been measured previously. Even in the former case, measurement errors that may occur in baseline measurement can be reduced. In the latter case, especially when the positional relationship between the projection image of the pattern image of the mask and the mark detection system has changed over time, the effects of these changes can be minimized.

Also, the measurement and computation in the first and second steps above may be performed after a predetermined number of substrates are processed. These steps may also be performed after a smaller number of substrates are exposed in the first half of a lot and after a larger number of substrates are exposed in the latter half of the lot. When the time-interval, at which baseline measurement is performed, is not constant, as described above, it is desirable to take into account the factor of elapsed time upon computing a new baseline amount. Then, the resulting baseline amount will have a lower error by incorporating the effect of the time-interval of baseline measurement.

It will be apparent to those skilled in the art that various modifications and variations can be made in the projection exposure apparatus and method of the present invention without departing from the spirit or scope of the invention. Thus, it is intended that the present invention cover the modifications and variations of this invention provided they come within the scope of the appended claims and their equivalents.

What is claimed is:

1. An exposure method for exposing a pattern image formed on a mask onto a substrate which includes the following:

a value pertaining to a first baseline amount for a detection apparatus equipped with a single detection position is measured before a first substrate is exposed;

a value pertaining to a second baseline amount for said detection apparatus is measured after said first substrate is exposed and before a second substrate, which is different from said first substrate, is exposed;

a new baseline amount is determined for said detection apparatus based on both said value pertaining to a first baseline amount measured and said value pertaining to a second baseline amount measured.

2. The exposure method of claim 1, wherein:

said first baseline amount is relative positional information between the single detection position of said detection apparatus and a pattern image position before exposure of said first substrate;

said second baseline amount is relative positional information between the single detection position of said detection apparatus and a pattern image position before exposure of said second substrate; and, said new baseline amount is relative positional information between the single detection position of said detection apparatus and a pattern image position as determined based on said first baseline amount and said second baseline amount.

3. The exposure method of claim 2, wherein:

said first substrate is held in place by a stage;

said first baseline amount is determined based on a first fiducial mark positional information obtained by detecting a fiducial mark disposed on said stage with said detection apparatus and based on the first stage positional information pertaining to a position of said stage when positioned on said detection position;

said second substrate is held in place by said stage; and, said second baseline amount is determined based on a second fiducial mark positional information obtained by detecting said fiducial mark disposed on said stage with said detection apparatus and based on the second stage positional information pertaining to the position of said stage when positioned on said detection position.

4. The exposure method of claim 3, wherein:

said first baseline amount is determined based on a plurality of said first fiducial mark positional information and a plurality of said first stage positional information;

said second baseline amount is determined based on a plurality of said second fiducial mark positional information and a plurality of said second stage positional information; and, wherein the number of the plurality of second fiducial mark positional information and second stage positional information is smaller than the number of said plurality of first fiducial mark positional information and first stage positional information.

5. The exposure method of claim 2, wherein:

first substrate positional information pertaining to a position of said first substrate is detected by said detection apparatus;

said mask pattern image is exposed onto said first substrate after said first substrate has been moved in response to said first substrate positional information and said first baseline amount;

a second substrate positional information pertaining to a position of said second substrate is detected by said detection apparatus; and, said mask pattern image is exposed onto said second substrate after said second substrate has been moved in response to said second substrate positional information and said new baseline amount.

6. The exposure method of claim 5, wherein:

said first and second substrate positional information are determined by statistical processing of a plurality of detection results by said detection apparatus.

7. The exposure method of claim 2, wherein:

said new baseline amount is determined at every predetermined number of substrates have been exposed.

8. The exposure method of claim 2, wherein:

said new baseline amount is determined by calculating an average value of the values pertaining to said first baseline amount and said second baseline amount.

9. The exposure method of claim 8, wherein:

the values pertaining to said first baseline amount and said second baseline amount are weighted differently and a weighted average value is calculated to determine said new baseline amount.

10. An exposure system for exposing a pattern image formed on a mask onto a substrate, comprising:

a detection apparatus which is equipped with a single detection position and which detects a position of said substrate at said detection position;

a baseline amount determining apparatus which is connected to said detection apparatus and which determines a baseline amount for said detection apparatus; and, said baseline amount determining apparatus measures a value pertaining to a first baseline amount for said detection apparatus before a first substrate is exposed, measures a value pertaining to a second baseline amount for said detection apparatus before a second substrate, which is different from said first substrate, is exposed, and determines a new baseline amount for said detection apparatus based on both said value pertaining to a first baseline amount measured and said value pertaining to a second baseline amount measured.

11. The exposure apparatus of claim 10, wherein:

said first baseline amount is relative positional information between the single detection position of said detection apparatus and a pattern image position before exposure of said first substrate;

said second baseline amount is relative positional information between the single detection position of said detection apparatus and a pattern image position before exposure of said second substrate; and said new baseline amount is relative positional information between the single detection position of said detection apparatus and a pattern image position as determined based on said first baseline amount and said second baseline amount.

12. The exposure apparatus of claim 11, comprising:

a stage for holding and moving a substrate, and an interferometer for detecting a position of said stage; and, said baseline amount determining apparatus is connected to said interferometer.

13. The exposure apparatus of claim 12, wherein:

a fiducial mark is disposed on said stage; and, detection positional information pertaining to the single detection position of said detection apparatus is determined by detecting said fiducial mark using said detection apparatus.

14. The exposure apparatus of claim 11, comprising:

a projection optical system for projecting a pattern image formed on said mask onto a substrate; and, said detection apparatus is disposed on a lateral portion of said projection optical system.

15. The exposure apparatus of claim 14, wherein said detection apparatus is an image processing system.

16. The exposure apparatus of claim 11, comprising:

a pattern image detection apparatus for detecting the position of said pattern image; and, said baseline amount determining apparatus is connected to said pattern image detection apparatus, and the positional information for said pattern image is obtained by detecting the position of said pattern image using said pattern image detection apparatus.

* * * * *